United States Patent [19]

Kranzler

[11] Patent Number: 5,317,215

[45] Date of Patent: May 31, 1994

[54] METHOD AND APPARATUS FOR FREQUENCY DISCRIMINATING COMPUTER NETWORK SIGNALS

[75] Inventor: David A. Kranzler, Belmont, Calif.

[73] Assignee: 3COM Corporation, Santa Clara, Calif.

[21] Appl. No.: 984,128

[22] Filed: Dec. 1, 1992

[51] Int. Cl.[5] ............................................. G01R 23/02
[52] U.S. Cl. .................................. 307/517; 328/138; 328/140; 307/522
[58] Field of Search ..................... 307/517, 522, 524; 328/138, 140

[56] References Cited

U.S. PATENT DOCUMENTS

| 4,326,256 | 4/1982 | Furumoto | 307/522 |
|---|---|---|---|
| 4,611,335 | 9/1986 | Arai et al. | 307/522 |
| 4,617,678 | 10/1986 | Devensky et al. | 307/517 |
| 4,692,710 | 9/1987 | Shooartsman | 328/111 |
| 4,763,341 | 8/1988 | Murphy | 328/111 |
| 5,180,935 | 1/1993 | Abdi et al. | 307/524 |
| 5,199,049 | 3/1993 | Wilson | |

Primary Examiner—Timothy P. Callahan
Assistant Examiner—Terry D. Cunningham
Attorney, Agent, or Firm—Townsend & Townsend Khourie & Crew

[57] ABSTRACT

A digital frequency discrimination circuit includes an edge detector coupled to receive a transmission signal for producing an edge detected signal; an edge timer including a shift register clocked by the clock signal and having the edge detected signal as a data input, and a timeout determining subcircuit having a plurality of bits of the shift register coupled as edge detection inputs, for determining and providing a timeout signal indicating whether any of the edge detection inputs represents an edge detection; and a state machine circuit coupled to receive the clock signal, the edge detected signal, and the timeout signal for producing an unsquelch signal indicating whether the transmission signal meets frequency discrimination requirements.

8 Claims, 4 Drawing Sheets

METHOD AND APPARATUS FOR FREQUENCY DISCRIMINATING COMPUTER NETWORK SIGNALS

BACKGROUND OF THE INVENTION

The invention relates generally to the field of computer networks, specifically to the field of Local Area Network (LAN) signal reception and qualification.

Data receivers used in LAN applications must qualify received signals; that is, discriminate between valid data signals and spurious noise. This function is commonly known as receive squelch. One typical standard for receive squelch is the IEEE 802.3 standard (hereby incorporated by reference in its entirety). Section 14 of this, for Ethernet over twisted pair wiring, requires that all signals not meeting minimum amplitude and frequency requirements be filtered out. Implementing the amplitude requirements is relatively straightforward, but implementing the frequency requirements is more complex.

The IEEE 802.3 standard has different specifications for different transmission media. A 10Base-T specification is illustrated in FIG. 1. The 10base-T interface is an alternative to the more standard Attachment Unit Interface ("AUI"), which is also discussed in the 802.3 specification and which shares a number of the requirements discussed here. Referring to FIG. 1, an Ethernet controller 10 is coupled through a Manchester encoder 20 and a Manchester decoder 30 to a Medium Attachment unit ("MAU") 40. MAU 40 receives data from twisted pair line 50 and transmits data on twisted pair line 60, in communication with another MAU at the other end of the twisted pair. The data is Manchester encoded prior to transmission in order to provide clocking information within the data stream.

The 10Base-T specification requires that receivers squelch out single-cycle signals and all signals below 2 MHz in frequency. Once the receiver has begun accepting data, it must accept all signals within the frequency range of 5 and 10 MHz, while tolerating edge "jitter" (referring to the allowable phase variation of a signal's zero crossing, either forward or backward in time) of up to ±13.5 ns. The receiver must "shut off" (terminate data reception) if no signal transitions, either rising or falling, are detected for 230 ns, indicating the end of a data packet.

A MAU receiver must also recognize another type of signal, distinct from data, namely, a "Link Pulse". A Link Pulse is an idle signal exchanged by MAUs over the twisted pair segment as part of a "Link Integrity Test" function. The Link Pulse verifies that the receive pair of one MAU is functionally connected to the transmit pair of another MAU, and vice versa. Every 16 ms (±8 ms) the MAU transmitter sends out a single 100 ns wide logic "1" (RD+ positive with respect to RD−) pulse. The MAU receiver at the other end of the segment must recognize this pulse as a valid Link Pulse, even though transmission-line effects may cause the pulse to "smear" out to 200 ns wide.

Conventional implementations of these frequency requirements have typically employed linear timing components, such as monostable multivibrators ("monostables"), based on resistive-capacitive time constants. For example, for data packet termination, the monostable would be triggered by edge transitions, and if no transition were received before it timed out, the receiver would treat the data packet as terminated and would shut off.

The conventional approach has two significant drawbacks: cost and accuracy. Space, and therefore cost, requirements of LAN adapters are becoming increasingly stringent, forcing them to be implemented with all of the necessary functions integrated together on a single ASIC (Application Specific Integrated Circuit). Linear functions, however, are expensive to integrate within an ASIC. Furthermore, linear functions such as monostables are not very accurate over the typical variations in temperature, voltage, and process conditions. Sufficient and consistent accuracy in the monostable to accept all signals having edge transitions occurring up to 127 ns apart, while rejecting those having edge transitions 230 ns apart, adds significant expense to the manufacturing environment for LAN equipment production.

SUMMARY OF THE INVENTION

The present invention provides a method and apparatus for digitally performing receive squelch for computer network signals. A digital implementation according to the present invention allows the receive squelch circuitry to be manufactured inexpensively and to be better integrated with the remainder of the adapter circuitry, such as within a single ASIC. Furthermore, the digital implementation exhibits better timing consistency and accuracy over variations in temperature, voltage, and manufacturing process conditions.

In one embodiment the invention takes the form of a frequency discrimination circuit including an edge detector coupled to receive a transmission signal to produce an edge detected signal; an edge timer coupled to receive a clock signal and the edge detected signal as inputs for producing a timeout signal; and a state machine circuit coupled to receive the clock signal, the edge detected signal, and the timeout signal for producing an unsquelch signal indicating whether the transmission signal meets frequency discrimination requirements.

A further understanding of the nature and advantages of the present invention may be realized by reference to the following portions of the specification and the drawings.

DESCRIPTION OF SPECIFIC EMBODIMENTS

Figure 2:
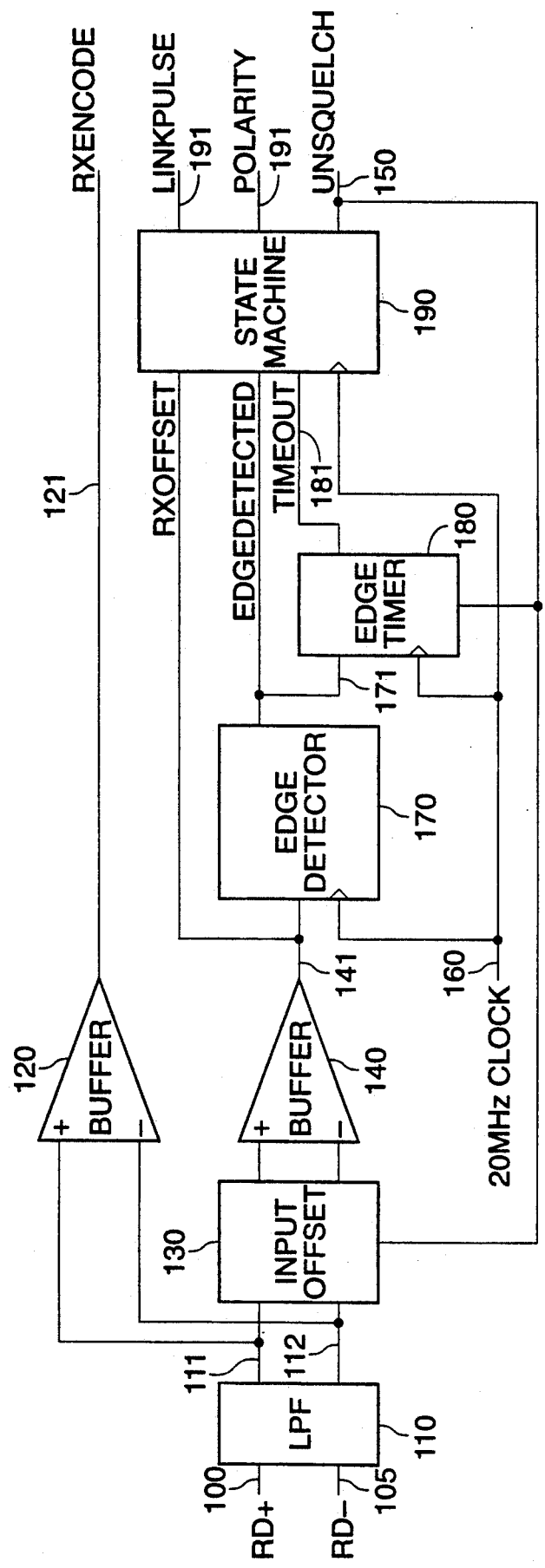
FIG. 2 is a block diagram illustrating a particular embodiment of a receive squelch circuit according to the present invention.

A particular embodiment of a receive squelch circuit according to the present invention is illustrated in FIG. 2. Essentially the same circuit, operating in different modes, has successfully been used with both 10Base-T interface and the more standard AUI, with a reduced cost and higher accuracy than linear timing component implementations.

OVERVIEW

Referring to FIG. 2, lines 100 and 105 are a respective RD+ and RD− receive pair from a LAN transmission medium. Lines 100 and 105 are coupled to a low pass filter ("LPF") 110, which includes a termination and attenuates high frequency (greater than 10 MHz) noise that may be present on the LAN medium. Outputs 111 and 112 of LPF 110 are coupled to a buffer 120 to produce a TTL RxEncode signal 121, and are also coupled through an input offset circuit 130 to another buffer 140 to produce a TTL RxOffset signal 141. Input offset circuit 130 is controlled by an Unsquelch signal 150 to apply a selectable offset voltage and thus reject signals smaller than a certain amplitude.

RxOffset signal 141 is provided together with a 20 MHz clock signal 160 to edge detector 170 to produce an edge-detected signal 171. Edge-detected signal 171 is then provided along with clock 160 and unsquelch signal 150 to an edge timer 180, which produces a timeout signal 181. RxOffset signal 141, edge-detected signal 171, timeout signal 181, and clock signal 160 are all provided to a state machine circuit 190, which produces a linkpulse signal 191, a polarity signal 192, and unsquelch signal 150.

If the input data stream consists of a single pulse meeting the 10Base-T specifications for a valid Link-Pulse, linkpulse signal 191 is asserted for use by a standard Link Pulse Integrity Test state machine, not shown (but described in detail in the 802.3 specification). If the data is determined to be a valid packet, unsquelch signal 150 is asserted high, which causes input offset circuit 130 to apply a lower offset voltage, thus providing some hysteresis during data packet reception in case the input signal amplitude sags somewhat. Unsquelch signal 150 may also be used to cause a manchester decoder to be driven by RxEncode signal 121, which has no extra jitter because no input offset voltage is applied to buffer 120. If the packet ends normally (with RD+ positive with respect to RD−), polarity signal 192 is asserted high. This can then be used by other, standard, logic to determine whether or not the wiring polarity of RD+/− is correct.

EDGE DETECTOR

Figure 1:
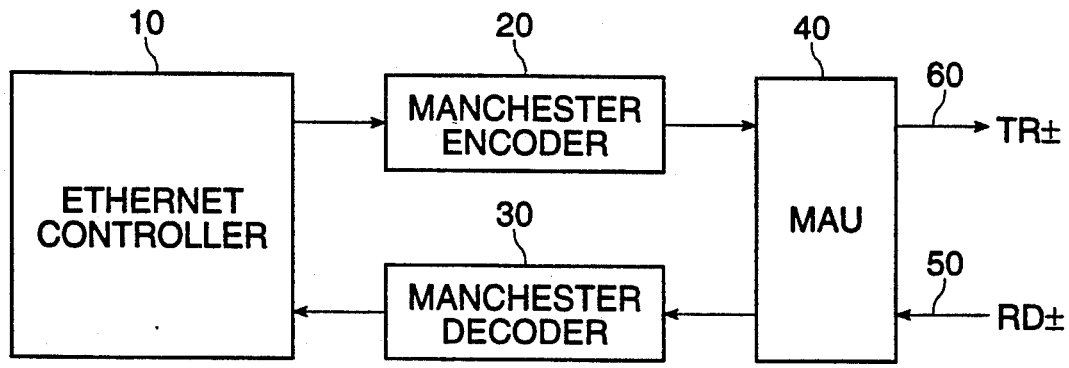
FIG. 1 is a block diagram of a 10Base-T LAN connection.
Figure 3:
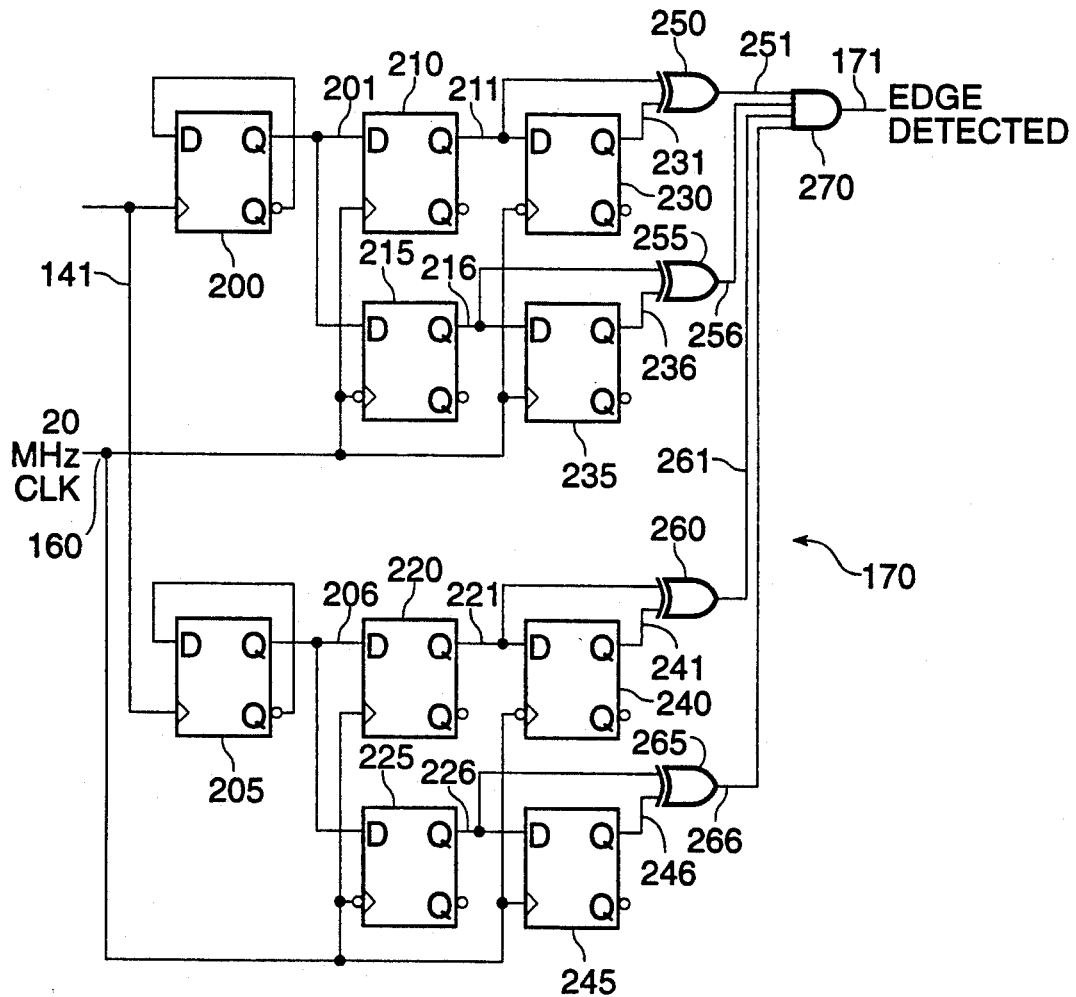
FIG. 3 is a block diagram illustrating an edge detector according to a particular embodiment of the present invention.

Edge detector 170 is illustrated in greater detail in FIG. 3. Rx Offset signal 141 drives the clock inputs of flipflops 200 and 205; flipflop 200 changes state on all positive RxOffset transitions, flipflop 205 changes state on all negative transitions. These state changes in outputs 201 and 206, respectively, are sampled by both edges of 20 MHz clock signal 160 (an effective 40 MHz sampling rate) by flipflops 210 and 215 (for flipflop 200) and flipflops 220 and 225 for flipflop 205. In this way an indication that a transition has been received is available within one-half a clock period (25 ns). Outputs 211, 216, 221, and 226 of flipflops 210, 215, 220 and 225, respectively, are provided to oppositely clocked respective flipflops 230, 235, 240 and 245, which produce outputs 231, 236, 241, and 246. Outputs 211, 216, 221, and 226 are XOR'd with respective outputs 231, 236, 241, and 246 by respective gates 250, 255, 260, and 265, to produce respective detect signals 251, 256, 261, and 266. Detect signals 251, 256, 261, and 266 are all OR'd by gate 270, which produces edge-detected signal 171.

In operation, the output of the first flipflop to sample the state change is XOR'd with the next (oppositely clocked) flipflop in the chain, producing a 25 ns wide logic high pulse edge-detected. If the first flipflop to sample the transition goes metastable, the transition will still be sampled reliably on the next edge of the clock. Since Ethernet data is limited to 10 MHz in frequency (and LPF 110 filters all high frequency noise), the Nyquist criterion assures that no valid data transitions will be missed.

EDGE TIMER

Figure 4:
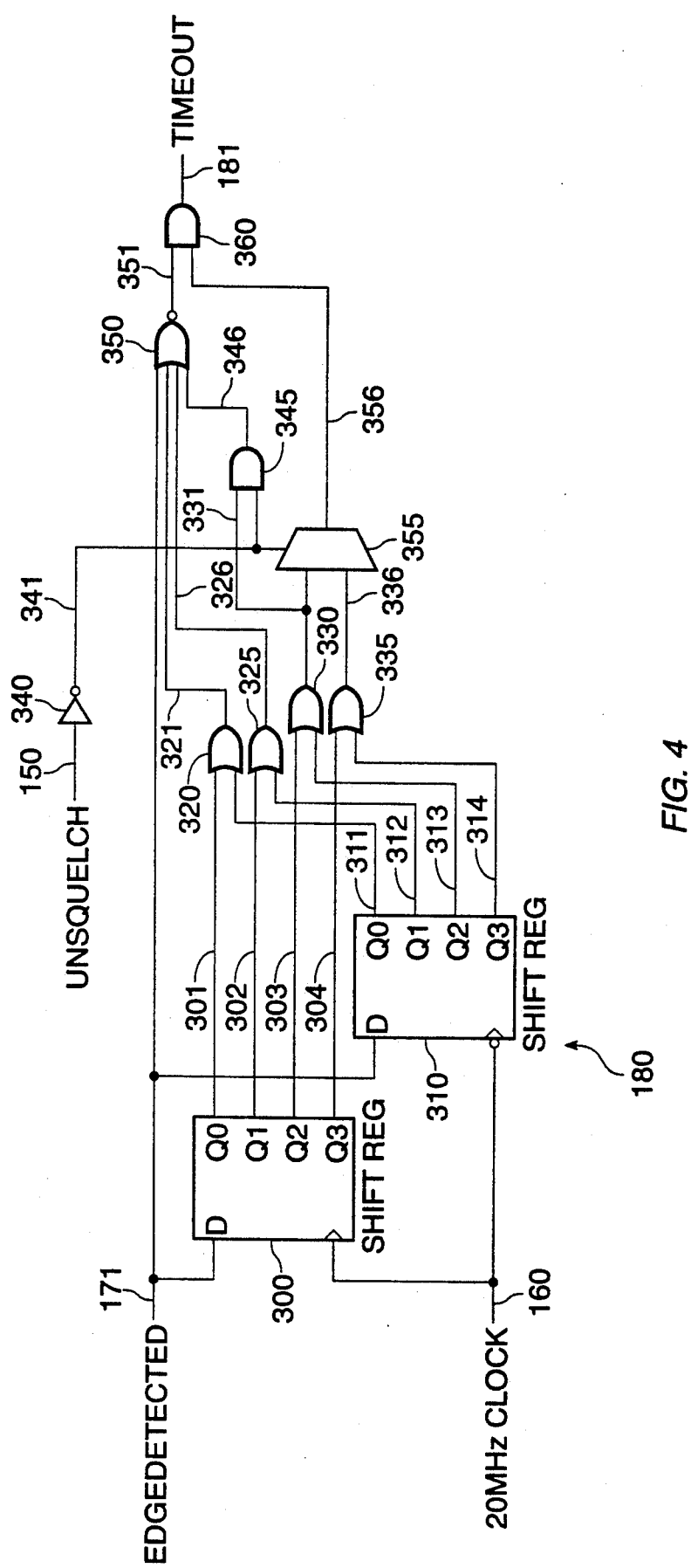
FIG. 4 is a block diagram illustrating an edge timer according to a particular embodiment of the present invention.

Edge timer 180 is illustrated in greater detail in FIG. 4. Edge detected signal 171 is provided as a data input both to four-bit shift register 300 and to four-bit shift register 310. Shift register 300 is clocked by the rising edge of clock 160, and shift register 310 is clocked by the falling edge of clock 160. The Q0–Q3 bits of shift registers 300 and 310 are lines 301–304 and 311–314, respectively. Each of lines 301–304 is OR'd with a respective one of lines 311–314 by OR gates 320, 325, 330, and 335, to produce respective unified Q0–Q3 outputs 321, 326, 331, and 336, indicating the presence of a detected edge at the particular bit position. Unsquelch signal 150 is gated by inverter 340 to produce a mode signal 341, which is also provided together with unified Q2 line 331 as inputs to AND gate 345 to produce gated Q2 signal 346. Edge-detected signal 171, unified Q0 signal 321, unified Q1 signal 326, and gated Q2 signal 346 are provided as inputs to NOR gate 350, which produces signal 351. Signal 351 assumes a high value to indicate the absence of a detected edge on the sampled lines. Mode signal 341 is applied as a control to two-input MUX 355, which has as inputs unified Q2 signal 331 and unified Q3 signal 336, and which produces sampling signal 356. Sampling signal 356 is then applied as an input along with signal 351 to AND gate 360, to produce timeout signal 181.

In operation, edge timer 180 times the duration between edge-detected pulses, and asserts timeout signal 181 when either 200–225 ns (between packets, when Unsquelch is low) or 175–200 ns (during packets, when Unsquelch is high) have expired between edge-detected pulses. The range within each timeout period results from synchronization delay within the edge detector. Different periods are employed during packets than between them to provide for accepting Link Pulses (up to 200 ns between edges) between packets, while reliably signaling the end of packet waveform (230 ns) during packets. 2 MHz signals (250 ns between edges) are always rejected; signals with maximum jitter (up to 127 ns between edges) are always accepted.

Edge detected pulses 171 are passed through the two 4-bit shift registers. When an edge detected pulse has fallen to the selected bit of the shift register (Q2 if unsquelch is high, Q3 otherwise), the outputs of the lower order shift register outputs and the edge detected signal are sampled. If the sampled lines do not show any edge detections, then timeout is asserted.

STATE MACHINE CIRCUIT

Figure 5:
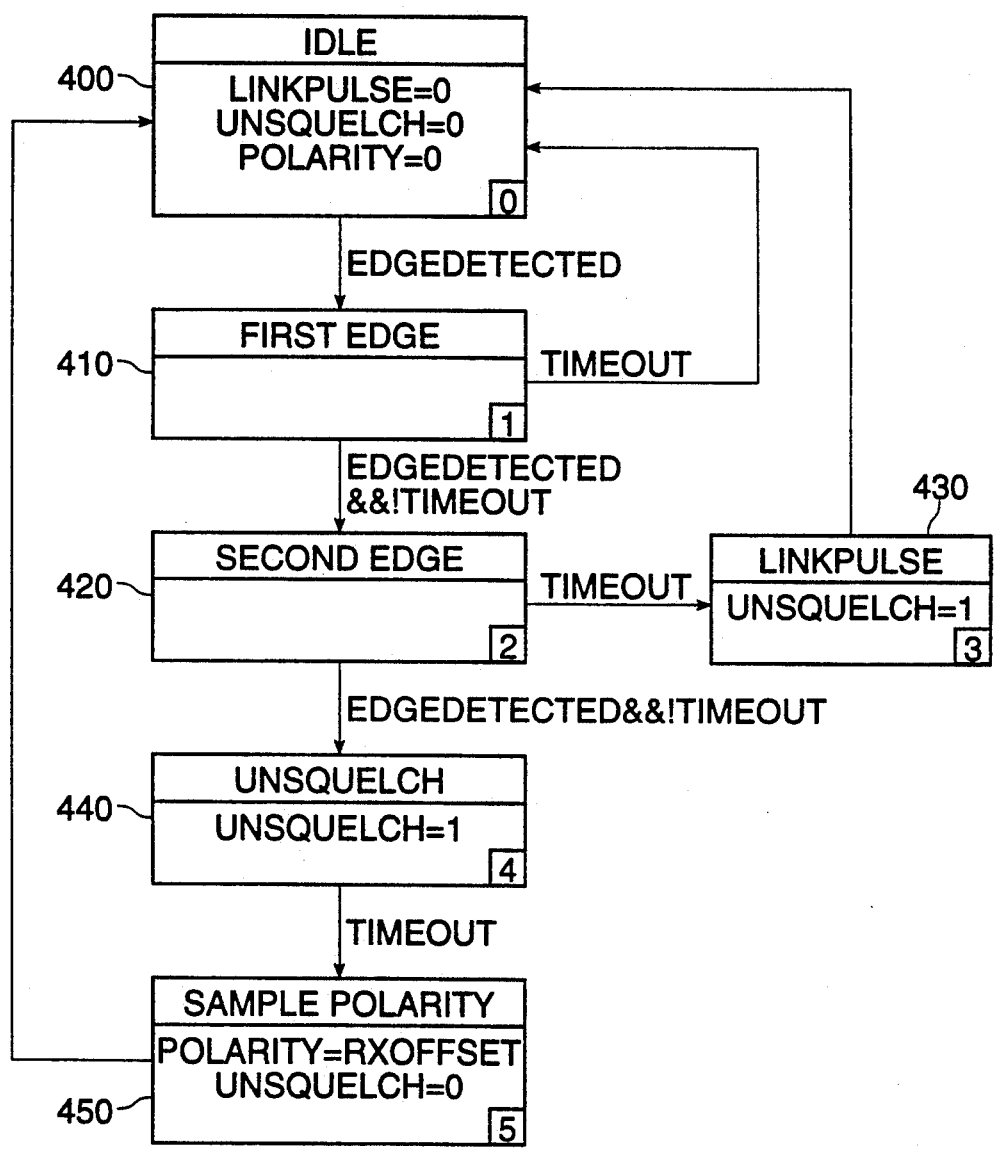
FIG. 5 is a state diagram of state machine circuit according to a particular embodiment of the present invention.

A state diagram for state machine circuit 190 is illustrated in FIG. 5. This state diagram can be easily implemented by any of a variety of standard methodologies. The state machine begins in an idle state 400, with the outputs Link Pulse 191, Polarity 192, and Unsquelch 150 all set at logic zero. Upon the reception of a logic one on the edge-detected input, the state machine transitions to state 410. From state 410 the state machine will revert to state 400 upon the receipt of a timeout signal (indicated the data received has a frequency not greater than 2 MHz), or will proceed to state 420 upon the receipt of another edge-detected signal prior to a timeout. From state 420, the state machine will upon receipt of a timeout signal proceed to state 430, wherein the LinkPulse signal is asserted, after which the state machine reverts to state 400. If, in state 420, yet another edge detected signal is received prior to a timeout, the state machine will advance to state 440, in which the unsquelch signal is asserted high. The state machine remains in state 440, receiving a data packet, until a timeout signal is received, at which point the state machine proceeds to state 450, in which Unsquelch is deasserted and the polarity signal is set to equal RxOffset, after which the state machine returns to idle state 400.

The state machine determines three conditions: the presence of a valid data packet, the presence of a valid link pulse, and the polarity of RD+ with respect to RD− at the end of a valid data packet. The state machine detects the beginning of a valid data packet by counting three consecutive edge detected indications. Indications are considered consecutive if edge-detected is sampled high twice in a row without timeout being sampled high. By rejecting signals that start with an edge detected pulse followed by a timeout pulse, any data less than 2 MHz is rejected. By ignoring the first two indications, all single cycle signals can be squelched out, per the 10Base-T specification. When a third consecutive edge has been detected, the unsquelch signal is asserted, and data from the transmission medium is now considered valid. If two consecutive edge detections are sampled, followed by a timeout, then a valid link pulse is assumed. Once a valid data packet is detected, at some point it will terminate, signalled by the reception of a timeout indication. At this point, RxOffset is sampled as a value for the Polarity signal. If low, then one of two events has most likely occurred: the receive pair wiring polarity is reversed, or the input data amplitude has fallen below the input offset threshold.

MODIFICATIONS FOR AUIS

Essentially the same circuits may be used to receive signals through an AUI. The differences are that there are no link pulses to be detected, and there is no single-cycle rejection requirement in the AUI specification. Therefore, mode line 341 of edge timer 180 may be tied low. Furthermore, state 430 would not be employed, and state 420 would automatically progress to state 440.

CONCLUSION

While the above is a complete description of the preferred embodiments of the invention, various alternatives, modifications, and equivalents may be used. Therefore, the above description should not be taken as limiting the scope of the invention, which is defined by the appended claims.

What is claimed is:

1. In a receiver for a Local Area Network (LAN) environment, a frequency discrimination circuit accepting as input a clock signal and a transmission signal, the frequency discrimination circuit comprising:
   a) an edge detector coupled to receive the clock signal and the transmission signal as inputs for producing an edge detected signal;
   b) an edge timer coupled to receive the clock signal and the edge detected signal as inputs for producing a timeout signal; and
   c) a state machine circuit coupled to receive the clock signal, the edge detected signal, and the timeout signal for producing an unsquelch signal indicating whether the transmission signal meets frequency discrimination requirements;
   wherein the edge detected signal is synchronous with the clock signal;
   wherein the edge timer comprises a shift register clocked by the clock signal and having the edge detected signal as a data input; and
   wherein the edge timer further comprises a timeout determining means having edge detection inputs, with a plurality of bits of the shift register coupled as edge detection inputs, for determining and providing a timeout signal indicating that none of the edge detection inputs represents an edge detection.

2. The frequency discrimination circuit of claim 1, wherein the shift register has an additional bit, wherein the frequency discrimination circuit additionally comprises a timeout mode input, and means, under control of the timeout mode input, for selectably providing the additional shift register bit as an edge detection input to the timeout determining means.

3. The frequency discrimination circuit of claim 1, wherein the edge detector samples the transmission signal at both falling edges and rising edges of the clock signal, and wherein the edge timer comprises:
   i) a first shift register clocked by rising edges of the clock signal and having the edge detected signal as an input; and
   ii) a second shift register clocked by falling edges of the clock signal and having the edge detected signal as an input.

4. The frequency discrimination circuit of claim 3, wherein the first shift register has a first additional bit, wherein the second shift register has a second additional bit, wherein the frequency discrimination circuit additionally comprises a timeout mode input, and means, under control of the timeout mode input, for selectably providing the first and second additional shift register bits as edge detection inputs to the timeout determining means.

5. In a receiver for receiving a network transmission signal of a local area network, a frequency discrimination circuit comprising:
   a) an edge detector coupled to receive the network transmission signal as an input, for producing an edge detected signal;
   b) an edge timer comprising
      i) a shift register clocked by a clock signal and having the edge detected signal as a data input, and
      ii) a timeout determining means having edge detection inputs, with a plurality of bits of the shift register coupled as edge detection inputs, for determining and providing a timeout signal indicating that none of the edge detection inputs represents an edge detection; and
   c) a state machine circuit coupled to receive the clock signal, the edge detected signal, and the timeout signal for producing an unsquelch signal indicating whether the transmission signal meets frequency discrimination requirements.

6. The frequency discrimination circuit of claim 5, wherein the state machine circuit is further for producing a LinkPulse signal indicating whether the transmission signal meets requirements for a valid LinkPulse.

7. The frequency discrimination circuit of claim 6, wherein the transmission signal is transmitted in twisted pair format having an RD+ line and an RD− line, and wherein the state machine circuit additionally receives the transmission signal and is further for producing a polarity signal indicating a polarity of the RD+ line with respect to the RD− line during and end of packet.

8. The frequency discrimination circuit of claim 7, wherein the state machine circuit receives the transmission signal in TTL format and comprises means for sampling the transmission signal under control of the timeout signal to produce the polarity signal.

* * * * *